United States Patent [19]

Itoh et al.

[11] Patent Number: 5,093,582
[45] Date of Patent: Mar. 3, 1992

[54] PULSE-WIDTH MODULATION WAVEFORM GENERATOR

[75] Inventors: Mitsuhiro Itoh; Hideo Matsui, both of Suita, Japan

[73] Assignee: Mitsubishi Denki Kabushiki Kaisha, Tokyo, Japan

[21] Appl. No.: 547,129

[22] Filed: Jul. 3, 1990

[30] Foreign Application Priority Data

Jul. 7, 1989 [JP]  Japan .................. 1-176286

[51] Int. Cl.⁵ .................. H03K 3/017; H03K 5/04
[52] U.S. Cl. .................. 307/265; 307/234; 328/58; 377/55
[58] Field of Search .................. 307/265, 234; 377/58, 377/55, 20, 56; 328/61, 58, 111

[56] References Cited

U.S. PATENT DOCUMENTS

| | | | |
|---|---|---|---|
| 3,805,167 | 4/1974 | Nash et al. | 307/265 |
| 3,840,815 | 10/1974 | Masters | 307/265 |
| 3,980,960 | 9/1976 | Hutchinson | 307/265 |
| 4,330,751 | 5/1982 | Swain | 307/265 |
| 4,979,194 | 12/1990 | Kawano | 307/265 |

FOREIGN PATENT DOCUMENTS 1560350  9/1977  United Kingdom .

OTHER PUBLICATIONS

Electronics; "One-Shot Multivibrator Has Programmed Pulse Width"; Stephen C. Armfield; Jul. 7, 1977; pp. 104–105.

*Primary Examiner*—Timothy P. Callahan

[57] ABSTRACT

A PWM waveform generator has a cycle timer for generating pulses at regular intervals, and a duty timer for generating a pulse of a program-selected duration after each pulse from the cycle timer. A register stores one bit of data which designates whether the PWM output starts high or low at the beginning of each cycle. The pulses from the cycle timer are fed through gates controlled by the register contents to the set and reset terminals of a flip-flop. Pulses from the duty timer cause the flip-flop to toggle. The starting level can be changed in any PWM cycle by rewriting the data in the register.

10 Claims, 1 Drawing Sheet

PULSE-WIDTH MODULATION WAVEFORM GENERATOR

BACKGROUND OF THE INVENTION

1. Field of the Invention

This invention relates to a pulse waveform generator for controlling of pulse waveform output of a microcomputer, more particularly to a pulse-width-modulation (PWM) waveform generator the output level of which can be selected in every PWM waveform output cycle.

2. Description of the Background Art

PWM waveform generators used in microcomputers have generally produced waveforms in which every cycle of the PWM waveform output starts from the same level, or at least the starting level cannot be changed during PWM waveform output. This considerably restricts the types of waveforms that can be obtained, and limits the usefulness of the PWM waveform generator.

SUMMARY OF THE INVENTION

An object of the present invention is accordingly to enable the starting level of a PWM waveform to be changed in any cycle during PWM waveform output.

A PWM waveform generator of an embodiment of the present invention comprises a cycle timer for generating pulses at regular intervals, a duty timer for generating one pulse of a certain duration when triggered by a pulse generated by said cycle timer, and register means for storing one bit of data indicating the desired starting level. Outputs from the register means gate the pulses from the cycle timer into the set and reset terminals of a flip-flop. Pulses from the duty timer cause the flip-flop to toggle. The output of the flip-flop is the output of the PWM waveform generator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION OF THE INVENTION

A novel PWM waveform generator of an embodiment of the present invention for use in microcomputers will be described with reference to the drawings.

Figure 1:
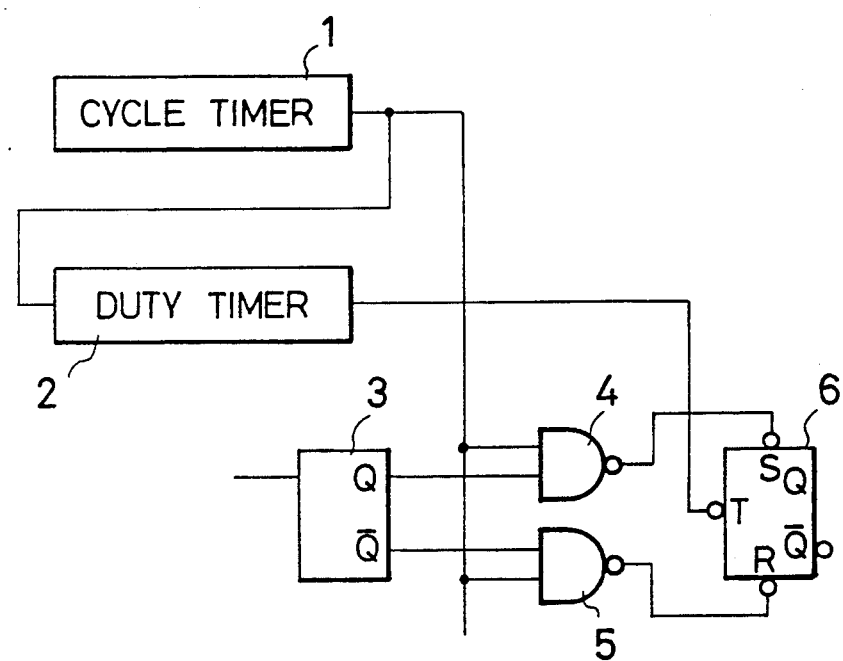
FIG. 1 is a schematic diagram of a novel PWM waveform generator.

With reference to FIG. 1, a microcomputer generates PWM waveform output by means of two program-controlled timers. A cycle timer 1 controls the length of the waveform cycle by producing a high pulse at regular intervals. The cycle timer 1 may be a well-known type of counter device. A duty timer 2 connected to the cycle timer 1 controls the duty cycle of the waveform by producing one high pulse with a certain duration starting for each pulse produced by the cycle timer 1. The duration of the pulse produced by the duty timer 2 is selectable under program control. The duty timer 2 may be a well-known one-shot multivibrator with programmable pulse width.

One bit of data representing the desired starting level of the PWM waveform is stored in a register, which in FIG. 1 is a D flip-flop 3. The first output (Q output) of the D flip-flop 3, representing the stored data, and the pulse output of the cycle timer 1 are provided to a first NAND gate 4. The second output ($\bar{Q}$ output) of the D flip-flop 3, representing the inverse of the stored data, and the pulse output of the cycle timer 1 are provided to a second NAND gate 5.

The PWM waveform is output by an edge-triggered RST flip-flop 6 having set (S), reset (R), and trigger (T) input terminals and Q and $\bar{Q}$ output terminals. Input of a falling edge at the R terminal resets the RST flip-flop 6, so that its Q output is low and its $\bar{Q}$ output is high. Input of a falling edge at the S terminal sets the RST flip-flop 6, so that its Q output is high and its $\bar{Q}$ output is low. Input of a falling edge at the T terminal toggles the RST flip-flop 6, causing the output states at the Q and $\bar{Q}$ terminals to reverse. The R terminal receives the output of the second NAND gate 5, the S terminal receives the output of the first NAND gate 4, and the T terminal receives the output of the duty timer 2.

The Q output of the RST flip-flop 6 is the output of the PWM waveform generator. The $\bar{Q}$ output of the RST flip-flop 6 is not used.

To have the PWM output start from the high level, high data is written in the D flip-flop 3, causing the Q output of the D flip-flop 3 to go high and its $\bar{Q}$ output to go low. The output of the first NAND gate 4 thus varies according to the output of the cycle timer 1 while the output of the second NAND gate 5 is held constantly high. At the start of the PWM cycle the cycle timer 1 generates a high pulse, the rising edge of which causes the output of the first NAND gate 4 to go low, thus setting the RST flip-flop 6. The Q output of the RST flip-flop 6 therefore goes high.

The rising edge of the pulse from the cycle timer 1 also triggers the duty timer 2, which begins output of a high pulse. After a program-selected time the output of the duty timer 2 goes low, creating a falling edge at the T terminal of the RST flip-flop 6 and causing the Q output of the RST flip-flop 6 to toggle to the low level.

The output of the PWM waveform generator thus goes high at the beginning of the cycle, then goes low after a program-selected time and remains low until the beginning of the next cycle.

To have the PWM output start from the low level, low data is written in the D flip-flop 3, causing the Q output of the D flip-flop 3 to go low and its $\bar{Q}$ output to go high. The output of the second NAND gate 5 now varies according to the output of the cycle timer 1 while the output of the first NAND gate 4 is held constantly high. The high pulse output by the cycle timer 1 thus resets the RST flip-flop 6, so that the PWM output goes low at the beginning of the cycle, then goes high at the end of the pulse output by the duty timer 2, and remains high until the beginning of the next cycle.

Figure 2:
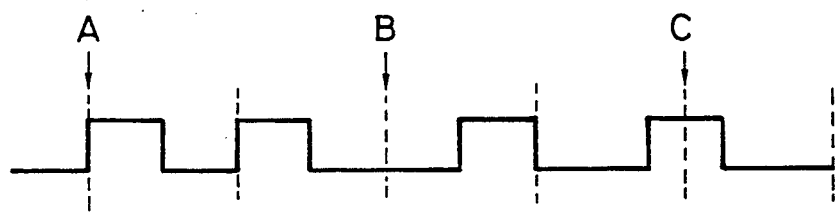
FIG. 2 is a waveform diagram illustrating the output of the PWM waveform generator in FIG. 1.

FIG. 2 shows an example of a waveform output using the PWM waveform generator of the above-noted embodiment. The dotted vertical lines indicate the start of PWM cycles. Prior to point A in FIG. 2 high data is set in the D flip-flop 3, and the duty timer 2 is set for a 50% duty cycle. During the second cycle, prior to point B, low data is written in the D flip-flop 3. During the third cycle the duty cycle is lengthened, and in the fourth cycle, prior to the point C, high data is written again in the D flip-flop 3. High and low pulses of arbitrary duration can be obtained in this way.

Although the starting level in FIG. 2 is changed only in the second and fourth cycles, in principle the starting level can be changed in every cycle. Waveforms can be generated that would be difficult to obtain by other means. In particular, waveforms needed for controlling inverters for three-phase AC motors can be generated easily.

The scope of this invention is not restricted to the circuit structure described above but includes various modifications and variations that would be apparent to one skilled in the art. For example, the cycle timer in FIG. 1 can generate low pulses instead of high pulses, and the NAND gates can be replaced with AND, OR, or NOR gates, depending on the valid edge of the R and S inputs of the RST flip-flop 6, and on the logic of the output from the cycle timer. Such variations are not to be regarded as a departure from the spirit and scope of the invention, and all such modifications are intended to be included within the scope of the following claims.

What is claimed is:

1. A PWM waveform generator for generating PWM waveforms with a selectable starting level, comprising:
   cycle timer means for generating first pulses at regular intervals;
   duty timer means for generating a second pulse of a certain duration when triggered by said first pulses generated by said cycle timer means;
   register means for storing one bit of data indicating a desired starting level, generating a first output representing the stored data, and generating a second output representing the inverse of the stored data; and
   flip-flop means for producing the PWM waveforms, said flip-flop means having a set terminal for receiving from said cycle timer means said first pulses gated by said first output in gating means, a reset terminal for receiving from said cycle timer means said first pulses gated by said second output in said gating means and a trigger terminal for receiving said second pulses from said duty timer.

2. A PWM waveform generator for generating PWM waveforms with a selectable starting level, comprising:
   cycle timer means for generating first pulses at regular intervals;
   duty timer means, coupled to said cycle timer means, for generating a second pulse of a certain duration when triggered by one of said first pulses generated by said cycle timer means;
   a D flip-flop for storing one bit of data and generating Q and $\overline{Q}$ outputs representing, respectively, the stored data and the inverse thereof;
   first gate means, coupled to said cycle timer means and said D flip-flop, for gating said first pulses output by said cycle timer means according to the Q output of said D flip-flop;
   second gate means, coupled to said cycle timer means and said D flip-flop, for gating said first pulses output by said cycle timer means according to the $\overline{Q}$ output of said D flip-flop; and
   an RS flip-flop coupled to said first gate means, said second gate means, and said duty timer means, for outputting the PWM waveforms,
   said RS flip-flop being set by the output of said first gate means, reset by the output of said second gate means, and toggled by said second pulse output of said duty timer means.

3. The PWM waveform generator of claim 2, wherein said first and second gate means are NAND gates.

4. The PWM waveform generator of claim 2, wherein said RS flip-flop is edge-triggered.

5. The PWM waveform generator of claim 1, wherein said gating means comprises a first NAND gate for gating said first pulses with said first output and a second NAND gate for gating said first pulses with said second output.

6. A method of generating PWM waveforms with a selectable starting level comprising the steps of:
   generating first pulses at regular intervals in cycle timer means;
   generating, in duty timer means, a second pulse of a certain duration when the duty timer means is triggered by said first pulses;
   storing a bit of data in register means to generate a first output representative of the stored data and a second output representative of the inverse of the stored data;
   gating the first pulses, in first gating means, in accordance with the first output of the register;
   gating the first pulses, in second gating means, in accordance with the second output of the register; and
   generating the PWM waveforms in flip-flop means, the flip-flop means being set by the output of the first gating means, reset by the output of the second gating means and toggled by the second pulse.

7. The method of generating PWM waveforms of claim 6, said step of generating a second pulse further comprising varying the duration of the second pulse to vary a duty cycle of the PWM waveforms.

8. The method of generating PWM waveforms of claim 7, the bit of data in the register determining starting values of each of the cycles of the PWM waveforms.

9. The method of generating PWM waveforms of claim 6, said steps of gating comprising gating the first pulses and the first and second outputs, respectively, in first and second NAND gates.

10. The method of generating PWM waveforms of claim 6, the flip-flop means being edge-triggered.

* * * * *